(12) United States Patent
Sakai et al.

(10) Patent No.: US 9,947,836 B2
(45) Date of Patent: Apr. 17, 2018

(54) ELECTRONIC DEVICE MOUNTING SUBSTRATE AND ELECTRONIC APPARATUS

(71) Applicant: KYOCERA Corporation, Kyoto-shi, Kyoto (JP)

(72) Inventors: Mitsuharu Sakai, Kyoto (JP); Shou Yamasaki, Kyoto (JP); Shigetoshi Inuyama, Kyoto (JP); Noritaka Niino, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/321,417

(22) PCT Filed: Mar. 26, 2015

(86) PCT No.: PCT/JP2015/059477
§ 371 (c)(1),
(2) Date: Dec. 22, 2016

(87) PCT Pub. No.: WO2016/042819
PCT Pub. Date: Mar. 24, 2016

(65) Prior Publication Data
US 2017/0213940 A1 Jul. 27, 2017

(30) Foreign Application Priority Data

Sep. 19, 2014 (JP) .................... 2014-191173

(51) Int. Cl.
*H01L 33/00* (2010.01)
*H01L 33/48* (2010.01)
(Continued)

(52) U.S. Cl.
CPC .......... *H01L 33/483* (2013.01); *H01L 23/053* (2013.01); *H01L 23/49822* (2013.01);
(Continued)

(58) Field of Classification Search
CPC ....... H01L 33/483; H01L 33/58; H01L 33/62; H01L 23/053; H01L 23/49822;
(Continued)

(56) References Cited

U.S. PATENT DOCUMENTS

| 6,921,971 B2 * | 7/2005 | Basho | ................... H01L 23/057 |
| | | | 257/675 |
| 7,948,069 B2 * | 5/2011 | Zhuang | ................. H01L 23/047 |
| | | | 257/678 |

(Continued)

FOREIGN PATENT DOCUMENTS

JP 2006-303400 A 11/2006

*Primary Examiner* — Mark Tornow
(74) *Attorney, Agent, or Firm* — Volpe and Koenig, P.C.

(57) ABSTRACT

An electronic device mounting substrate includes: a first wiring substrate shaped in a rectangular frame, an interior of the rectangular frame constituting a first through hole; a second wiring substrate shaped in a rectangular frame or plate, the second wiring substrate being disposed so as to overlie a lower surface of the first wiring substrate and be electrically connected to the first wiring substrate; a metallic plate disposed so as to overlie a lower surface of the second wiring substrate so that the second wiring substrate is sandwiched between the metallic plate and the first wiring substrate; and a lens holder secured to an outer periphery of the metallic plate. A frame interior of the first wiring substrate, or a frame interior of each of the first wiring substrate and the second wiring substrate, constitutes an electronic device mounting space.

7 Claims, 10 Drawing Sheets

(51) Int. Cl.
    *H01L 23/053*     (2006.01)
    *H01L 27/146*     (2006.01)
    *H01L 31/0203*     (2014.01)
    *H01L 23/498*     (2006.01)
    *H01L 31/0232*     (2014.01)
    *H01L 33/58*     (2010.01)
    *H01L 31/02*     (2006.01)
    *H01L 33/62*     (2010.01)

(52) U.S. Cl.
    CPC .. *H01L 27/14618* (2013.01); *H01L 27/14625* (2013.01); *H01L 27/14636* (2013.01); *H01L 31/02002* (2013.01); *H01L 31/0203* (2013.01); *H01L 31/02325* (2013.01); *H01L 33/58* (2013.01); *H01L 33/62* (2013.01)

(58) Field of Classification Search
    CPC ......... H01L 27/79822; H01L 27/14618; H01L 27/14625; H01L 27/14636; H01L 31/02002; H01L 31/0203
    See application file for complete search history.

(56) References Cited

U.S. PATENT DOCUMENTS

| | | | |
|---|---|---|---|
| 9,596,751 B2* | 3/2017 | Yamada | H05K 1/0271 |
| 2006/0249835 A1* | 11/2006 | Miyauchi | H01L 23/047 |
| | | | 257/706 |
| 2007/0029664 A1* | 2/2007 | Mohammed | H01L 21/50 |
| | | | 257/706 |

\* cited by examiner

ELECTRONIC DEVICE MOUNTING SUBSTRATE AND ELECTRONIC APPARATUS

TECHNICAL FIELD

The present invention relates to an electronic device mounting substrate for mounting an electronic component, for example, an image pickup device of CCD (Charge Coupled Device) type or CMOS (Complementary Metal Oxide Semiconductor) type, and a light-emitting device such as LED (Light Emitting Diode), as well as to an electronic apparatus.

BACKGROUND ART

Heretofore there is known an electronic apparatus constructed of an electronic device mounting substrate with an electronic device mounted thereon. As the electronic device mounting substrate used for such an electronic apparatus, there is known one comprising a metallic base body and a frame-shaped wiring substrate. To construct the electronic apparatus, an electronic device is mounted on the electronic device mounting substrate, and, a lid body is disposed on the upper surface of the wiring substrate. In the electronic apparatus thereby constructed, the electronic device is mounted in a recess defined by the upper surface of a thermal diffusion metallic layer disposed on the upper surface of the metallic base body and the inner side surface of the frame-shaped wiring substrate, and, an external circuit and so forth are electrically connected to an external circuit connection electrode disposed on a surface of the wiring substrate such as the upper surface thereof (refer to Japanese Unexamined Patent Publication JP-A 2006-303400).

Higher and higher performance capabilities have been demanded in portable terminal equipment as typified by smartphones, information processing equipment as typified by PCs (Personal Computers), and digital home-use appliances as typified by digital cameras, and, in order to respond to such a demand, it is necessary to mount a larger number of electronic apparatuses in a single housing. However, housings can no longer be given an increased capacity, wherefore housing capacity inevitably remains at its present level, or, on the contrary, it has come to be reduced. This trend has created the necessity of downsizing and low-profile design of electronic apparatuses. In the case of the electronic apparatus described in JP-A 2006-303400, it is conceivable that the thickness of the metallic base body of the electronic device mounting substrate will be reduced to render the electronic apparatus lower in profile.

In this electronic apparatus, when the lid body is subjected to an impact, a stress is applied to the wiring substrate. However, if the metallic base body has a reduced thickness for low-profile design of the apparatus, the applied stress will cause warpage or fracture in the wiring substrate. After all, it is not easy to achieve the low-profile design by the reduction of the thickness of the metallic base body.

An object of the invention is to provide an electronic device mounting substrate and an electronic apparatus which are capable of enhancement in impact resistance.

SUMMARY OF INVENTION

An electronic device mounting substrate according to an embodiment of the invention comprises a first wiring substrate shaped in a rectangular frame, an interior of the rectangular frame constituting a first through hole; and a second wiring substrate shaped in a rectangular frame or plate, the second wiring substrate being disposed so as to overlie a lower surface of the first wiring substrate and be electrically connected to the first wiring substrate, one of outer edges of the second wiring substrate being located more outward than a corresponding one of outer edges of the first wiring substrate. The electronic device mounting substrate further comprises a metallic plate disposed so as to overlie a lower surface of the second wiring substrate so that the second wiring substrate is sandwiched between the metallic plate and the first wiring substrate, outer edges of the metallic plate being located more outward than an outer edge of the first wiring substrate and more inward than the one of the outer edges of the second wiring substrate; and a lid body secured to an outer periphery of the metallic plate, with the one of the outer edges of the second wiring substrate lying in between, so as to cover the first wiring substrate and the second wiring substrate. In this construction, a frame interior of the first wiring substrate, or a frame interior of each of the first wiring substrate and the second wiring substrate, constitutes an electronic device mounting space.

An electronic device mounting substrate according to another embodiment of the invention comprises a first wiring substrate shaped in a rectangular frame, an interior of the rectangular frame constituting a first through hole; and a second wiring substrate shaped in a rectangular frame or plate, the second wiring substrate being disposed so as to overlie a lower surface of the first wiring substrate and be electrically connected to the first wiring substrate, one of outer edges of the second wiring substrate being located more outward than a corresponding one of outer edges of the first wiring substrate. The electronic device mounting substrate further comprises a rectangular metallic plate disposed so as to overlie a lower surface of the second wiring substrate so that the second wiring substrate is sandwiched between the rectangular metallic plate and the first wiring substrate; and a lid body secured to an outer periphery of the second wiring substrate so as to cover the first wiring substrate. In this construction, a frame interior of the first wiring substrate, or a frame interior of each of the first wiring substrate and the second wiring substrate, constitutes an electronic device mounting space.

An electronic apparatus according to one embodiment of the invention comprises the electronic device mounting substrate mentioned above, and an electronic device mounted within the electronic device mounting space.

DESCRIPTION OF EMBODIMENTS

Hereinafter, several exemplificative embodiments of the invention will be described with reference to drawings. In the following description, a construction comprising an electronic device mounting substrate with an electronic device mounted thereon will be defined as an electronic apparatus. Although each of opposite sides of the electronic device mounting substrate, as well as the electronic apparatus, can be either a top or a bottom, for purposes of convenience, the definitions of upper and lower surfaces are based on an x-y-z rectangular coordinate system in which a positive z-axis direction corresponds to an upward direction.

First Embodiment

An electronic apparatus 21 and an electronic device mounting substrate 1 according to a first embodiment of the invention will be described with reference to FIGS. 1 and 2. The electronic apparatus 21 in this embodiment comprises the electronic device mounting substrate 1 and an electronic device 10.

Figure 1:
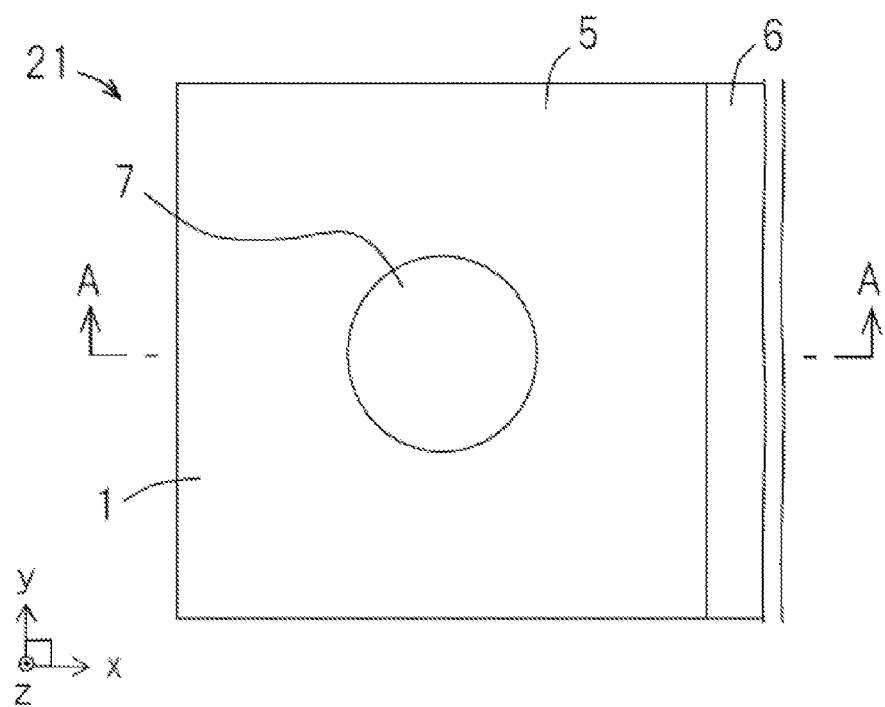
FIG. 1 is a top view showing the appearances of an electronic device mounting substrate and an electronic apparatus according to a first embodiment of the invention.
Figure 2:
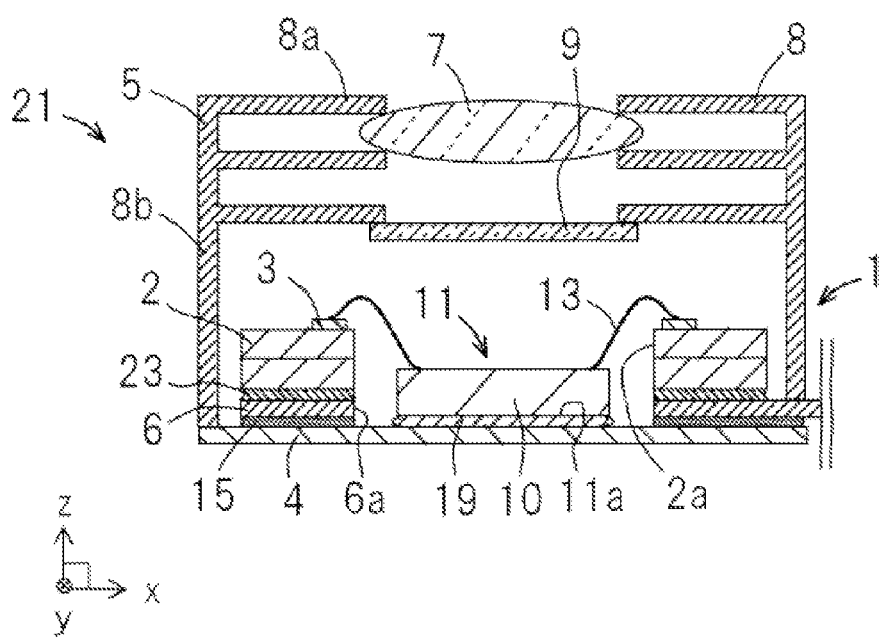
FIG. 2 is a vertical sectional view taken along the line A-A depicted in FIG. 1.
Figure 3:
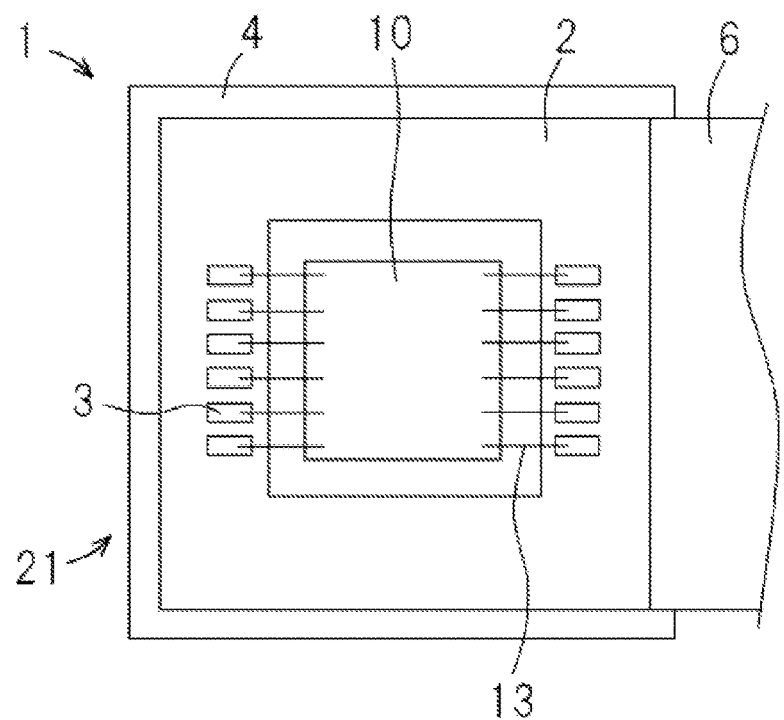
FIG. 3 is a top view showing the appearances of the electronic device mounting substrate and the electronic apparatus according to the first embodiment of the invention, illustrating the positional relationship among outer peripheries of a metallic plate, a first wiring substrate, and a second wiring substrate.

FIG. 1 is a top view showing the appearances of the electronic device mounting substrate and the electronic apparatus according to the first embodiment of the invention, and FIG. 2 is a vertical sectional view taken along the line A-A depicted in FIG. 1. FIG. 3 is a top view showing the appearances of the electronic device mounting substrate and the electronic apparatus according to the first embodiment of the invention, illustrating the positional relationship among the outer peripheries of a metallic plate, a first wiring substrate, and a second wiring substrate.

In the example shown in FIGS. 1 and 2, the electronic device mounting substrate 1 comprises: a first wiring substrate 2 shaped in a rectangular frame, an interior of the rectangular frame constituting a first through hole 2a; a second wiring substrate 6 shaped in a rectangular frame or plate, the second wiring substrate 6 being disposed so as to overlie a lower surface of the first wiring substrate 2 and be electrically connected to the first wiring substrate 2, one of outer edges being located more outwardly than a corresponding one of outer edges of the first wiring substrate 2; a metallic plate 4 disposed so as to overlie a lower surface of the second wiring substrate 6 so that the second wiring substrate 6 is sandwiched between the metallic plate 4 and the first wiring substrate 2, outer edges of the metallic plate 4 being located more outward than the outer edges of the first wiring substrate 2 and more inward than the one of outer edges of the second wiring substrate 6; and a lens holder 5 which is a lid body secured to an outer periphery of the metallic plate 4, with the one of the outer edges of the second wiring substrate 6 lying in between, so as to cover the first wiring substrate 2 and the second wiring substrate 6. In this construction, a frame interior of the first wiring substrate 2, or a frame interior of each of the first wiring substrate 2 and the second wiring substrate 6, constitutes an electronic device mounting space 11. Where the second wiring substrate 6 is frame-shaped, the metallic plate 4 has an electronic device mounting portion 11a formed on its upper surface region which is exposed to a second through hole 6a for the mounting of the electronic device 10.

The outer edges of the metallic plate 4 are located more outward than the outer edges of the first wiring substrate 2 and more inward than the one side (the first side) of the second wiring substrate 6, as viewed from the top. That is, the metallic plate 4 is greater in outside shape than the first wiring substrate 2, and thus the outer edges of the upper surface of the metallic plate 4, except for a part thereof located on a first-side side of the second wiring substrate 6, is exposed. The lens holder 5 is secured directly to the exposed outer edges of the upper surface of the metallic plate 4.

In the example shown in FIGS. 1 and 2, a electronic device connection pad 3 is disposed on the upper surface of the first wiring substrate 2. On the upper surface of the first wiring substrate 2, in addition to the electronic device connection pad 3, a circuit device such as a resistor device or a capacitor device may be mounted via a circuit device connection pad. Moreover, an external circuit connection electrode may be disposed on the lower surface of the first wiring substrate 2 (not shown in the drawings).

The first wiring substrate 2 is constructed of an insulating substrate formed with a wiring conductor as described later. As the insulating material for forming the insulating substrate, for example, electrically insulating ceramics or resin is used. In the example shown in FIG. 1, the first wiring substrate 2 is constructed by stacking a plurality of insulating layers made of the above-described material together vertically. The first wiring substrate 2 may be composed either of two insulating layers as an example shown in FIG. 1, or of a single insulating layer or three or more insulating layers. Preferably, the first wiring substrate 2 is designed as an electrically insulating ceramic wiring substrate.

The first wiring substrate 2 may be internally provided with a wiring conductor composed of internal wiring and a through conductor formed so as to pass through each insulating layer, or, a wiring conductor may be disposed in an exposed condition on the upper or lower surface of the first wiring substrate 2. Such a wiring conductor may be intended to establish electrical connection between the external circuit connection electrode and the electronic device connection pad 3 or the circuit device connection pad.

Moreover, the external circuit connection electrode may be disposed also on the upper surface or the side surface of the first wiring substrate 2. For example, the external circuit connection electrode is provided to electrically connect the first wiring substrate 2 to the second wiring substrate 6 described later or, for example, external equipment.

In the example shown in FIGS. 1 and 2, the second wiring substrate 6 has a rectangular-frame form, and is disposed so as to overlie the lower surface of the first wiring substrate 2 and be electrically connected to the first wiring substrate 2.

In the second wiring substrate 6 as viewed from the top, the long side is 8.5 to 100 mm in length, and the short side is 5 to 50 mm in length.

In the example shown in FIGS. 1 and 2, the second wiring substrate 6 is composed of an insulating layer made of an insulating material similar to the above-described insulating material used for the insulating layer constituting the first wiring substrate 2. The second wiring substrate 6 may be composed either of a single insulating layer as an example shown in FIG. 2 or of two or more insulating layers stacked together in the vertical direction. Note that the first wiring substrate 2 has a rectangular outer periphery as viewed from the top, which is 4.5 to 50 mm on a side.

When designed to be composed of two or more insulating layers, the second wiring substrate 6 may be internally provided with a wiring conductor composed of internal wiring and a through conductor formed so as to pass through each insulating layer, or, a wiring conductor may be disposed in an exposed condition on the upper or lower surface of the second wiring substrate 6. Such a wiring conductor may include an external circuit connection electrode, and, in this case, the first wiring substrate 2 and the second wiring substrate 6 may be electrically connected to each other via their respective external circuit connection electrodes.

In the example shown in FIGS. 1 and 2, the first wiring substrate 2 and the second wiring substrate 6 are electrically connected to each other via an electrically-conductive external circuit connection member 23. For example, an external circuit connection electrode (not shown) disposed on the lower surface of the first wiring substrate 2 is connected, via the external circuit connection member 23, to an external circuit connection electrode (not shown) disposed on the upper surface of the second wiring substrate 6. Examples of a material for forming the conductive external circuit connection member 23 include a metal material such as solder, a resin adhesive containing a conductive filler, and a resin material which exhibits electrical conductivity such as an anisotropic conductive film (ACF).

Moreover, it is desirable to dispose an insulating adhesive member in an external circuit connection member 23-free region of the space between the lower surface of the first wiring substrate 2 and the upper surface of the second wiring substrate 6. This makes it possible to increase the joining strength between the first wiring substrate 2 and the second wiring substrate 6. Moreover, in the above-described space, the insulating adhesive member fills a gap between a plurality of external circuit connection members 23, thus preventing external intrusion of dust through the gap. In addition, the insulating adhesive member helps suppress occurrence of short-circuiting between the adjacent external circuit connection members 23 in the presence of dust.

Examples of a material for forming the insulating adhesive member include a resin material containing thermosetting resin, such as Bisphenol A liquid epoxy resin.

When the insulating material for forming each of the insulating layers constituting the first wiring substrate 2 and the second wiring substrate 6 is electrically insulating ceramics, the electronic device connection pad 3, the external circuit connection electrode, and the wiring conductor attached to the first and second wiring substrates 2 and 6 are made of tungsten (W), molybdenum (Mo), manganese (Mn), silver (Ag), copper (Cu), gold (Au), nickel (Ni), platinum (Pt), chromium (Cr), titanium (Ti), aluminum (Al), or an alloy containing at least one materials selected from the aforenamed metal materials.

Moreover, when the insulating material for forming each of the insulating layers constituting the first wiring substrate 2 and the second wiring substrate 6 is resin, the electronic device connection pad 3, the external circuit connection electrode, and the wiring conductor attached to the first and second wiring substrates 2 and 6 are made of copper (Cu), gold (Au), aluminum (Al), nickel (Ni), chromium (Cr), molybdenum (Mo), titanium (Ti), or an alloy containing at least one materials selected from the aforenamed metal materials.

It is desirable to dispose a plating layer on the exposed surfaces of the electronic device connection pad 3, the external circuit connection electrode, and the wiring conductor attached to the first and second wiring substrates 2 and 6. This arrangement makes it possible to provide protection for the exposed surfaces of the electronic device connection pad 3, the external circuit connection electrode, and the wiring conductor from oxidation. It is also possible to achieve good electrical connection between the electronic device connection pad 3 and the electronic device 10 via a bonding wire or other means, or good electrical connection between the external circuit connection electrode of the first wiring substrate 2 and the external circuit connection electrode of the first wiring substrate 2. For example, the plating layer may be obtained by deposition of a Ni plating layer having a thickness of 0.5 to 10 µm. Moreover, a gold (Au) plating layer having a thickness of 0.5 to 3 µm may be additionally deposited on the Ni plating layer.

In the example shown in FIGS. 1 and 2, the metallic plate 4 is disposed so as to overlie the lower surface of the second wiring substrate 6 so that the second wiring substrate 6 is sandwiched between the metallic plate 4 and the first wiring substrate 2. As the examples shown in FIGS. 1 and 2, the outer edges of the metallic plate 4 are located more outward than the outer edges of the first wiring substrate 2 and more inward than one of the outer edges of the second wiring substrate 6, as viewed from the top. The metallic plate 4 has a rectangular form as viewed from the top, which is 5 to 50 mm on a side.

For example, the metallic plate 4 is made of stainless steel (SUS), a Fe—Ni—Co alloy, 42 Alloy, copper (Cu), or a copper alloy. While the thickness of the metallic plate 4 may be set at given suitable value with consideration given to the types of materials in use, required mechanical strength, and so forth, to render the electronic device mounting substrate 1 and the electronic apparatus 21 lower in profile, for example, the metallic plate 4 is preferably designed to have a thickness of 0.02 to 0.2 mm.

In the example shown in FIGS. 1 and 2, the metallic plate 4 is joined to the second wiring substrate 6 by a joining material 15 made of, for example, a brazing metal, a thermosetting resin, or a low-melting-point glass. Moreover, the joining material 15 may be of an electrically-conductive material such as an anisotropic conductive film (ACF). As the thermosetting resin, for example, Bisphenol A liquid epoxy resin may be used. As the joining material 15, a material which is not denatured under heat generated during the mounting of the electronic device 10 or its operation is desirable for use in the interest of satisfactorily restraining the metallic plate 4 against separation from the second wiring substrate 6 during the mounting of the electronic device 10 or its operation.

In general, the first wiring substrate 2 and the metallic plate 4 are made of different constituent materials, and thus have different coefficients of thermal expansion. For example, when the insulating material for forming each of the insulating layers constituting the first wiring substrate 2 is an aluminum oxide sintered body, the first wiring substrate 2 has a coefficient of thermal expansion of $7.1 \times 10^{-6}/°$ C., and, when the metallic plate 4 is formed of SUS 304, the metallic plate 4 has a coefficient of thermal expansion of $17.3\times10^{-6}/°$ C. The first wiring substrate 2 and the metallic plate 4 are heated in the process of mounting the electronic device 10, in the operation of the electronic device 10, or in the process of producing the electronic device mounting substrate 1. The difference in thermal expansion coefficient between the first wiring substrate and the metallic plate 4 causes a difference in thermal expansion and contraction between these members. Due to the difference in thermal expansion and contraction between the first wiring substrate 2 and the metallic plate 4, the joining material acting to bond the first wiring substrate 2 and the metallic plate 4 together is subjected to stress concentration. Consequently, in the case where the electronic device mounting substrate 1 undergoes repeated heat generation or heat application, the joining material acting to bond the first wiring substrate 2 and the metallic plate 4 together is prone to cracking or chipping.

Thus, where the first wiring substrate 2 and the metallic plate 4 are joined to each other by the joining material, satisfactory stress relaxation cannot be achieved due to the small thickness of the joining material, which may lead to occurrence of cracking or chipping in the joining material. Furthermore, an increase in the thickness of the joining material in an attempt to obtain higher stress-relaxation effect may cause deterioration in joining capability, and also make low-profile design difficult.

In this regard, it is preferable that the second wiring substrate 6 is made smaller in elastic modulus than the first wiring substrate 2 and the metallic plate 4. With the interposition of the second wiring substrate 6 having a relatively low elastic modulus between the first wiring substrate and the metallic plate 4, as in the case of increasing the thickness of the joining material, a thermal stress resulting from the difference in thermal expansion coefficient between the first wiring substrate 2 and the metallic plate 4 can be relaxed by the deformation of the second wiring substrate 6, thus achieving thermal-stress reduction. This makes it possible to suppress occurrence of chipping and cracking in the joining material 15 and the external circuit connection member 23.

Moreover, as described earlier, the second wiring substrate has the wiring conductor, and thus, in addition to being capable of stress relaxation, serves also as a wiring board. This makes it possible to eliminate the need to provide a wiring board separately from a stress relaxation layer, and thereby reduce the thickness of the electronic device mounting substrate 1 as a whole, thus rendering the electronic apparatus 21 lower in profile.

Moreover, the second wiring substrate 6 has sufficiently high stress-relaxation capability, wherefore there is no need to increase the thickness of the joining material 15 located on the lower surface of the second wiring substrate 6 for stress relaxation. This makes it possible to suppress the above-described deterioration in the bonding capability of the joining material.

Moreover, by virtue of the interposition of the second wiring substrate 6 between the first wiring substrate 2 and the metallic plate 4, the joining material 15, which would allow direct connection of the first wiring substrate 2 and the metallic plate 4 in the related art, can be divided into the joining material 15 and the external circuit connection member 23. This makes it possible to disperse a thermal stress generated between the first wiring substrate 2 and the metallic plate 4.

As employed herein the elastic modulus may be construed as a physical property value of a material predominantly constituting a corresponding member. For example, the elastic moduli of the first wiring substrate 2 and the second wiring substrate 6 may be construed as physical property values of the insulating substrates constituting these wiring substrates. Moreover, the elastic modulus of the metallic plate 4 may be construed as a physical property value of the metal material constituting the metallic plate 4.

For example, when the first wiring substrate 2 is formed of an aluminum oxide sintered body, the elastic modulus of the first wiring substrate 2 may be construed as an elastic modulus of aluminum oxide which is a physical property value.

The following describes specific examples of the materials for forming the first wiring substrate 2, the second wiring substrate 6, and the metallic plate 4. Selection of materials used for these members may be made so as to comply with the above-described interpretations, as well as to fulfill a relationship such that the second wiring substrate is smaller in elastic modulus than the first wiring substrate and the metallic plate.

Examples of electrically insulating ceramics used as the insulating material for forming the insulating layer constituting the first wiring substrate 2 include an aluminum oxide sintered body, a mullite sintered body, a silicon carbide sintered body, an aluminum nitride sintered body, a silicon nitride sintered body, and a glass ceramics sintered body.

Examples of resin used as the insulating material for forming the insulating layer constituting the first wiring substrate 2 include epoxy resin, polyimide resin, polyester resin, acrylic resin, phenol resin, and fluorine resin. Examples of the fluorine resin include tetrafluoroethylene resin.

Examples of electrically insulating ceramics used as the insulating material for forming the insulating layer constituting the second wiring substrate 6 include an aluminum oxide sintered body and a glass ceramics sintered body.

Examples of resin used as the insulating material for forming the insulating layer constituting the second wiring substrate 6 include epoxy resin, polyimide resin, polyester resin, acrylic resin, phenol resin, and fluorine resin. Examples of the fluorine resin include tetrafluoroethylene resin.

When a resin material is used as the insulating material for forming the insulating layer constituting the second wiring substrate 6, the second wiring substrate 6 may be construed as a so-called flexible wiring substrate.

The metallic plate 4 is made of, for example, stainless steel (SUS), a Fe—Ni—Co alloy, 42 Alloy, copper (Cu), or a copper alloy.

Examples of combinations of materials constituting the individual members will be given below. When the insulating material constituting the first wiring substrate 2 is an aluminum oxide sintered body (elastic modulus: about 200 to 370 GPa), and the metallic plate 4 is SUS 304 (elastic modulus: about 190 to 210 GPa), then polyimide resin (elastic modulus: about 3 to 7 GPa) is used as the insulating material constituting the second wiring substrate 6.

Moreover, it is preferable that the first wiring substrate 2 and the second wiring substrate 6 are joined to each other by the external circuit connection member 23 made of electrically-conductive resin. In this case, since the conductive resin has a relatively small elastic modulus compared to a case where, for example, the external circuit connection member 23 is made of a brazing metal, it follows that the external circuit connection member 23 in itself becomes easily deformable. Consequently, as is the case with the second wiring substrate 6, the external circuit connection member 23 can conform to thermal expansion of the first wiring substrate 2, thus achieving thermal stress relaxation. This makes it possible to restrain the first wiring substrate 2 and the second wiring substrate 6 against mutual separation.

Moreover, it is preferable that the external circuit connection member 23 is made of anisotropic conductive resin. In this case, the external circuit connection member 23 can be provided so as to extend circumferentially of the first through hole 2a and the second through hole 6a along the periphery of the electronic device mounting space 11. This makes it possible to maintain the hermeticity of the electronic device mounting space 11 while preventing occurrence of short-circuiting between the external circuit connection electrodes at the lower surface of the first wiring substrate 2.

The lens holder 5 comprises an optical lens 7 and a lens retaining portion 8 for retaining the optical lens 7 in a manner such that its optical axis is directed toward the electronic device mounting portion 11a. As the example shown in FIG. 2, the lens holder 5 may be further provided with an optical filter 9, such as an IR filter, which is located on the optical axis. Examples of the optical lens 7 include lenses of various shapes such as a convex lens, a concave lens or a Fresnel lens. It is sufficient that the optical lens 7 has various optical functions depending on the type of the electronic device 10 which is mounted on the electronic device mounting substrate 1. For example, where the electronic device 10 is an image pickup device or a light-receiving device, the optical lens 7 condenses extraneous incident light on the surface of the image pickup device. On the other hand, where the electronic device 10 is a light-receiving device, the optical lens 7 condenses, diverges, or collimates exit light from the light-receiving device.

The lens retaining portion 8 is made of a resin material such for example as polybutylene terephthalate (PBT). The lens retaining portion 8 has substantially the shape of an open-bottomed cube or prism having a through hole at its upper surface 8a. The optical lens 7 is retained so as to be fitted in the through hole.

A side wall 8b of the lens retaining portion 8 covers the first wiring substrate 1 and the second wiring substrate 6 from the side, and, the upper surface 8a covers the entire first wiring substrate 1 and the second wiring substrate 6, except for the one side, from above. The lower end of the side wall 8b of the lens retaining portion 8 is secured directly to the outer periphery of the upper surface of the metallic plate 4 which is exposed around the first wiring substrate 2. As employed herein the direct securement means that the lens holder 5 and the metallic plate 4, and more specifically, the side wall 8b of the lens retaining portion 8 and the outer periphery of the upper surface of the metallic plate 4, are secured to each other by a securing material, such as an adhesive, without the interposition of the first wiring substrate 2 and the second wiring substrate 6 between the lens holder 5 and the metallic plate 4. The lens retaining portion 8 is made of a resin material, whereas the metallic plate 4 is made of a metal material. Accordingly, as the adhesive for fixing these members, any of adhesives capable of resin-to-metal bonding, for example, an epoxy-resin adhesive or an acrylic-resin adhesive can be used. Moreover, the lens holder 5 and the metallic plate 4 may be secured to each other by mechanical securing means such as screw-fastening means or nut-and-bolt fastening means.

The exposed area of the electronic device mounting substrate 1 and the electronic apparatus 21 is constituted mainly by the lens holder 5, the metallic plate 4, and part of the one side of the second wiring substrate 6. When the electronic device mounting substrate 1 and the electronic apparatus 21 are subjected to an external impact, most of the impact is applied to the lens holder 5. Moreover, in the case where the electronic apparatus 21 is installed in portable terminal equipment or the like, two situations will be considered, i.e. a situation where the electronic apparatus 21 is entirely placed within the housing of the portable terminal equipment and a situation where part of the electronic apparatus 21 is exposed out of the housing. The apparatus is subjected to an impact of greater magnitude when being partly exposed out of the housing than when being entirely housed within the housing. Where the lid body serves as the lens holder 5, the peripheral part of the optical lens 7 is exposed out of the housing, wherefore an external impact is applied directly to the lens holder 5. In this regard, in the electronic device mounting substrate 1 and the electronic apparatus 21 according to the invention, even under an external impact, since the lens holder 5 in the form of the lid body is secured directly to the metallic plate 4, it is possible to reduce a stress transmitted to the first wiring substrate 2 and the second wiring substrate 6, and thereby suppress occurrence of warpage and fracture in the first wiring substrate 2 and the second wiring substrate 6. Consequently, the metallic plate 4 can be made thinner than would be the case of the related art, thus rendering the electronic device mounting substrate 1 and the electronic apparatus 21 lower in profile.

Next, the electronic apparatus 21 will be described with reference to FIG. 2. In the example shown in FIG. 2, the electronic apparatus 21 comprises the electronic device mounting substrate 1, and the electronic device 10 mounted on the electronic device mounting portion 11a of the upper surface of the metallic plate 4 within the electronic device mounting space 11.

As the electronic device 10, for example, an image pickup device of CCD type or CMOS type, a light-emitting device such as LED, a light-receiving device such as a photodetector, a semiconductor memory device, or a computing device such as ASIC may be used. In the example shown in FIG. 2, each electrode of the electronic device 10 is electrically connected, via a connecting member 13 (bonding wire), to the electronic device connection pad 3. Instead of the bonding wire, for example, a gold bump or solder may be used for the connecting member 13.

Moreover, in the example shown in FIG. 2, the electronic device 10 is disposed on the upper surface of the metallic plate (electronic device mounting portion 11a) via an adhesive 19. For example, a silver-epoxy material or thermosetting resin may be used as the adhesive 19. The electronic device 10 is mounted directly on the metallic plate 4 via the adhesive 19, wherefore heat generated during the operation of the electronic device 10 is readily transferred to the metallic plate 4. This makes it possible to improve heat dissipation at the metallic plate 4, and thereby provide cooling for the electronic device 10 with higher cooling capability.

Since the metallic plate 4 also functions as a grounding electrode of the electronic device 10 and the second wiring substrate 6, a grounding potential in the electronic device 10 and the second wiring substrate 6 becomes stable.

In the case where the electronic device 10 is an image pickup device, a focal distance from the optical lens 7 to the light-receiving surface of the image pickup device depends on the optical lens 7 and image pickup device used. Moreover, the lower the lens holder 5 height, the lower the electronic apparatus 21 height, thus permitting low-profile design. Owing to the fixed focal distance, the height of the lens holder 5 depends on the level of the surface of the image pickup device within the electronic apparatus 21. When the image pickup device is mounted on the upper surface of the metallic plate 4, the surface of the image pickup device within the electronic apparatus 21 is at the lowest level. Thus, in this embodiment, the electronic apparatus 21 can be designed to have a minimum height.

Although the lens retaining portion 8 is shaped in a rectangular parallelepiped in the example shown in FIGS. 1 and 2, the form of the lens retaining portion 8 is not limited to any particular shape. For example, a cylindrical shape, a polygonal-tube shape, a hemispherical shape, or a dome shape may be adopted.

Moreover, the lower end of the lens retaining portion 8 does not necessarily have to be secured, at its entire perimeter, directly to the outer periphery of the metallic plate 4, and thus, the lower end may be partly secured directly to the outer periphery. For example, in this embodiment, three out of four side walls 8*b* of the lens retaining portion 8 are secured directly to the outer periphery of the metallic plate 4. The remaining one of the side walls 8*b* is shorter than the other three side walls 8*b*, and a lower end thereof is cut away. Such a cutaway constitutes a clearance between the metallic plate 4 and the side wall 8*b*, from which part of the second wiring substrate 6 which is a flexible wiring substrate extends. This extending part of the second wiring substrate 6 is provided with a connection pad or the like for further connection with another wiring substrate or mounting substrate. Moreover, the cut-away lower end of the side wall 8*b* and the upper surface of the extending part of the second wiring substrate 6 may be fixedly attached to each other by an adhesive or other means.

The electronic apparatus 21 according to the invention, comprising the thereby constructed electronic device mounting substrate 1 and the electronic device 10 mounted within the electronic device mounting space 11, is capable of minimizing occurrence of warpage and fracture in the first wiring substrate 2 and the second wiring substrate 6 when subjected to an external impact, and is thus capable of providing more satisfactory hermetic-sealing capability.

As the example shown in FIG. 2, it is preferable that the first wiring substrate 2 and the second wiring substrate 6 are disposed so as to be clear of the lens holder 5, except for the side wall 8*b* of the lens retaining portion 8 through which the second wiring substrate 6 protrudes from within the lens retaining portion 8 to the exterior thereof. That is, it is preferable that a clearance is formed between the inner surface of the side wall 8*b* and the outer side surface of the first wiring substrate 2, and that a clearance is formed between the inner surface of the side wall 8*b* and the outer side surface of the second wiring substrate 6. If the side wall 8*b* of the lens retaining portion 8 is in contact with the first and second wiring substrates 2 and 6, when the lens holder 5 is subjected to an external impact, a stress may be transmitted, through their contacting regions, to the first wiring substrate 2 and the second wiring substrate 6. In this regard, where the side wall 8*b* of the lens retaining portion 8 is clear of the first and second wiring substrates 2 and 6, the stress transmitted to the first wiring substrate 2 and the second wiring substrate 6 can be reduced.

Moreover, in the example shown in FIG. 2, an outer edge at the opposite side of the second wiring substrate 6 to the one side thereof is positioned so as to overlie an outer edge at a side of the first wiring substrate 2 which corresponds to the opposite side of the second wiring substrate 6 to the one side thereof, as viewed from the top. In this case, the area of connection between the first wiring substrate 2 and the second wiring substrate 6 is wider than would be a case where, for example, the outer edge at the opposite side of the second wiring substrate 6 to the one side thereof is located more inward than the outer edge at the side of the first wiring substrate 2 which corresponds to the opposite side of the second wiring substrate 6 to the one side thereof. Thus, when a thermal stress is developed due to thermal contraction or thermal expansion between the first wiring substrate 2 and the second wiring substrate 6 following generation of heat in the electronic device 10, the stress exerted on the external circuit connection member 23 interposed between the first wiring substrate 2 and the second wiring substrate 6 can be reduced. This makes it possible to restrain the first wiring substrate 2 and the second wiring substrate 6 against mutual separation.

Moreover, in keeping with the recent trend toward more and more functions in the electronic device 10, the number of the electronic device connection pads 3 and the external circuit connection electrodes is on the increase, with a consequent increase in area required for the connection of these members. In this regard, by overlying the outer edge positioned at the opposite side of the second wiring substrate 6 to the one side thereof with the outer edge positioned at the side of the first wiring substrate 2 which corresponds to the opposite side of the second wiring substrate 6 to the one side thereof as viewed from the top, it is possible to provide a wider wiring region for the second wiring substrate 6 than would be a case where, for example, the outer edge at the opposite side of the second wiring substrate 6 to the one side thereof is located more inward than the outer edge at the side of the first wiring substrate 2 which corresponds to the opposite side of the second wiring substrate 6 to the one side thereof, and thereby afford adaptability to increasingly higher pin counts in the electronic device mounting substrate 1. Note that this advantageous effect may be obtained also by locating the outer edge of the second wiring substrate 6 more outward than the outer edge of the first wiring substrate 2.

Moreover, in the example shown in FIG. 2, the inner side surface of the second through hole 6*a* is disposed so as to overlie the inner side surface of the first through hole 2*a*, as viewed from the top. That is, the second through hole 6*a* is formed so as to overlie the first through hole 2*a*. This arrangement makes it possible to mount the electronic device 10 in proximity to the inner side surface of the second through hole 6*a*, and thereby reduce the distance between the electronic device connection pad 3 disposed on the upper surface of the first wiring substrate 2 and the electronic device 10. Thus, where the connecting member 13 is formed of a bonding wire or the like, the loop length of the wire can be reduced. The reduction of the wire loop length makes it possible to lower the resistance value of the bonding wire and thereby suppress its temperature rise. Both an increase in the temperature of the bonding wire and an increase in the temperature of the first and second wiring substrates 2 and 6 making connection with the bonding wire for signal reception can be reduced. Consequently, the electronic device mounting substrate 1 as a whole is less prone to be brought into high-temperature conditions, thus reducing deformation resulting from the difference in thermal expansion coefficient between the first wiring substrate 2 and the metallic plate 4. This makes it possible to suppress occurrence of separation between the first wiring substrate 2 and the metallic plate 4, or occurrence of cracking. Each of the first through hole 2*a* and the second through hole 6*a* has a rectangular form as viewed from the top, which is 2.5 to 40 mm on a side.

Moreover, the reduction of the wire loop length makes it possible to lower the inductance of the bonding wire and thereby achieve improvement in signal transmission characteristics.

Moreover, where the inner side surface of the second through hole 6a overlies the inner side surface of the first through hole 2a as viewed from the top, in the process of joining the first wiring substrate 2 and the second wiring substrate 6 together, it is possible to make a visual check for the possibility of joining misalignment, and thus allow the easy checking of the extent of joining misalignment between an external connection terminal of the first wiring substrate 2 and an electrode of the second wiring substrate 6. Consequently, the simplification of manufacturing process can be achieved.

Also in the following embodiments, the same advantageous effects as above described are obtainable so long as the inner side surface of the second through hole 6a is disposed so as to overlie the inner side surface of the first through hole 2a, as viewed from the top.

Figure 7:
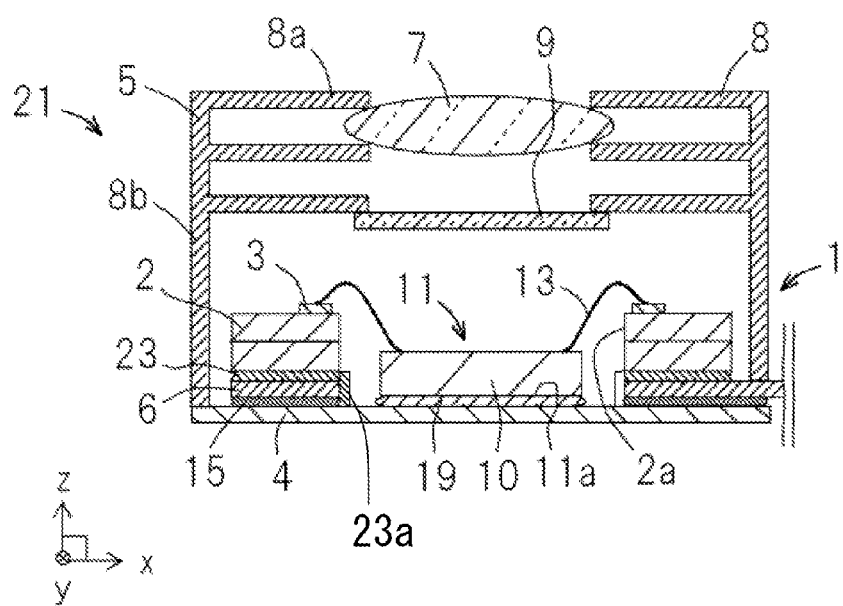
FIG. 7 is a vertical sectional view showing a modified example of the electronic device mounting substrate and the electronic apparatus according to the invention.

FIG. 7 is a vertical sectional view showing a modified example of the electronic device mounting substrate and the electronic apparatus according to the invention. As shown in FIG. 7, by forming an external circuit connection member 23a extending from the external circuit connection member 23 to the side surface of the second wiring substrate 6 facing the side surface of the electronic device 10, it is possible to prevent dust arising from the second wiring substrate 6 from finding its way into the electronic device mounting space 11. Moreover, when using the external circuit connection member 23a as a member for covering the side surface of the second wiring substrate 6, the side surface of the second wiring substrate 6 can be covered in the process of connecting the first wiring substrate 2 to the second wiring substrate 6, thus suppressing fly-off of the dust arising from the second wiring substrate 6 toward the region between the electronic device 10 and the optical lens 7.

Figure 8:
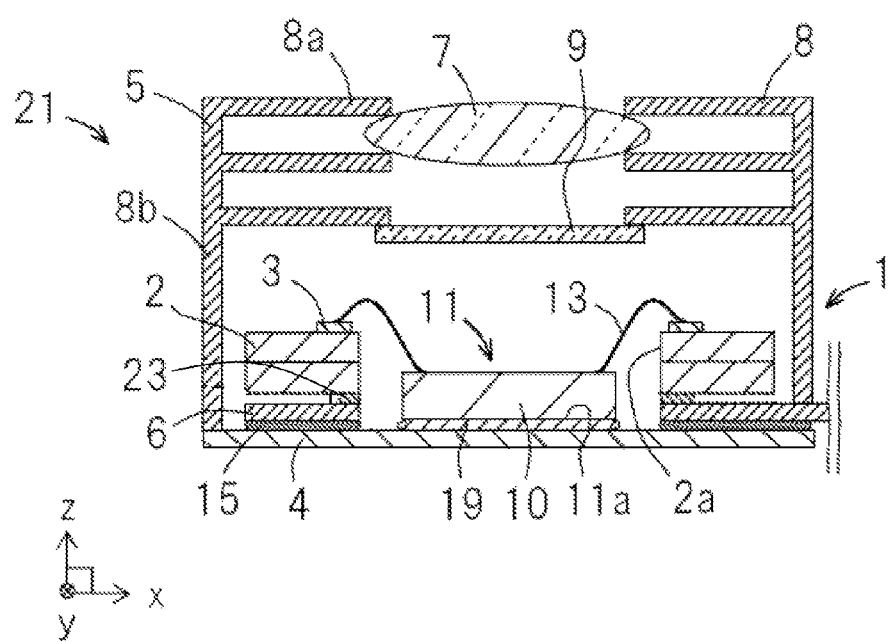
FIG. 8 is a vertical sectional view showing a modified example of the electronic device mounting substrate and the electronic apparatus according to the invention.

FIG. 8 is a vertical sectional view showing a modified example of the electronic device mounting substrate and the electronic apparatus according to the invention. In setting the lens retaining portion 8, the side wall 8b of the lens retaining portion 8 is joined directly onto the metallic plate 4, and, at this time, a stress is applied downwardly to the metallic plate 4 from above a stress-arising point where mutual direct joining takes place, thus causing the metallic plate 4 to warp upwardly. In this regard, where the external circuit connection electrode, which is disposed on the upper surface of the second wiring substrate 6, is located in a position close to the electronic device 10, as shown in FIG. 8, the external circuit connection member 23 is disposed on a part of the upper surface of the second wiring substrate 6 which is located closer to the electronic device 10. In this case, the stress tends to be applied to the metallic plate 4 in a direction in which its central part is pressed down from above. This makes it possible to restrain the metallic plate 4 from warping upwardly, and thereby hold the lens retaining portion 8 and the metallic plate 4 in a mutually connected state for maintaining the electronic-device 10 sealing capability satisfactorily.

Figure 9:
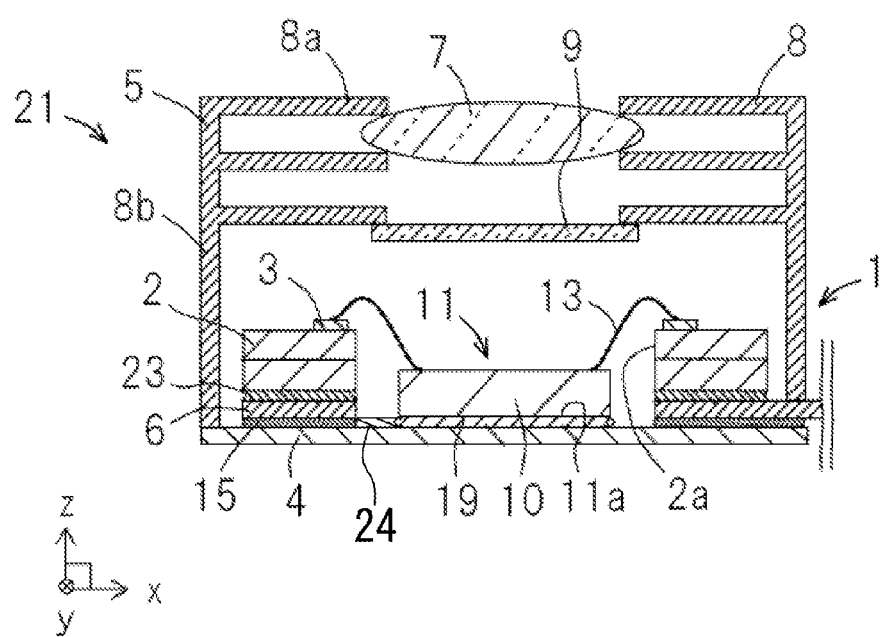
FIG. 9 is a vertical sectional view showing a modified example of the electronic device mounting substrate and the electronic apparatus according to the invention.

FIG. 9 is a vertical sectional view showing a modified example of the electronic device mounting substrate and the electronic apparatus according to the invention. As shown in FIG. 9, a light-absorbing layer 24 may be disposed on a part of the upper surface of the metallic plate 4 which is located between the second wiring substrate 6 and the electronic device 10. In this example, the light-absorbing layer 24 is disposed so as to extend across the joining material 15 and the adhesive 19. The light-absorbing layer 24 covers the upper surface of the metallic plate 4 around the electronic device 10, leaving no exposed part. The placement of the light-absorbing layer 24 diminishes the likelihood that incident light which cannot have been received by the electronic device 10 will be reflected from the upper surface of the metallic plate 4 with the consequence that the reflected light re-enters the electronic device 10 serving as an image pickup device. This helps suppress adverse effects upon the performance capability of the electronic device 10. For example, metal such as titanium, nickel, or chromium, or oxide of metal such as titanium or iron, is used for the light-absorbing layer 24. The light-absorbing layer 24 may also be formed by subjecting the metallic plate 4 to heating process (blackening process). Moreover, as the light-absorbing layer 24, use can be made of an antireflection coating (AR Coating) which is obtained by vapor deposition of magnesium fluoride, for example.

Figure 10:
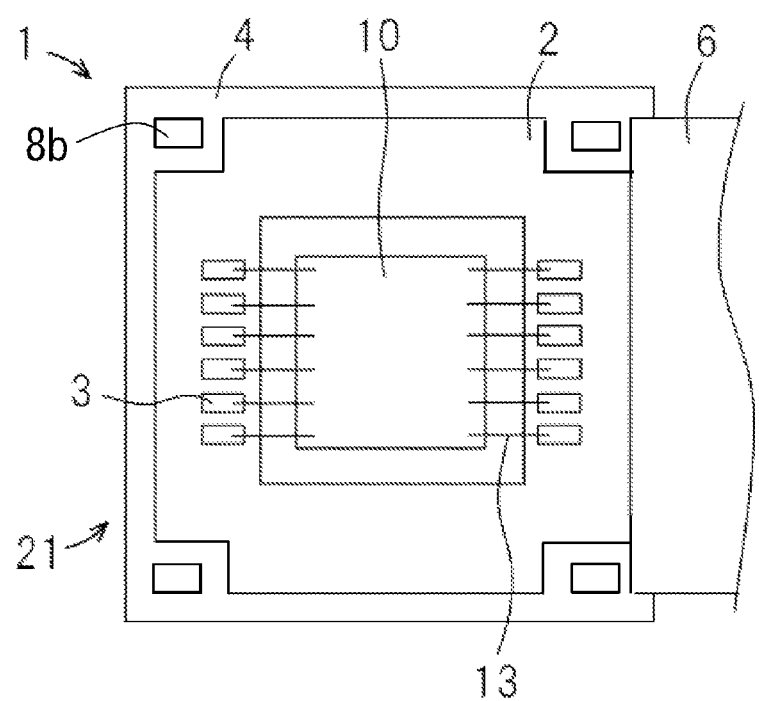
FIG. 10 is a top view showing the appearance of a modified example of the electronic device mounting substrate and the electronic apparatus according to the invention, illustrating the positional relationship among the first wiring substrate, the metallic plate, and outer edges of a lower end of a sidewall of a lens retaining member.

FIG. 10 is a top view showing the appearance of a modified example of the electronic device mounting substrate and the electronic apparatus according to the invention, illustrating the positional relationship among the first wiring substrate, the metallic plate, and the outer periphery of the lower end of the sidewall of a lens retaining member. As shown in FIG. 10, the first wiring substrate 2 has an outer periphery in the shape of a cross (defined by a rectangle cutaway at four corners), so that the first wiring substrate 2 can be provided over as large an area as possible on the metallic plate 4. Moreover, the side wall 8b of the lens retaining portion 8 may be connected to each cut-away corner part of the first wiring substrate 2. Thus, by imparting a maximum permissible area to the first wiring substrate 2 within the design limit, it is possible to provide greater design flexibility in wiring to be formed in the first wiring substrate 2.

Next, an example of methods for manufacturing the electronic apparatus 21 in this embodiment will be described.

The following example of manufacturing method is through the use of a segmentable wiring board.

(1) First, a ceramic green sheet which constitutes the first wiring substrate 2 is formed. For example, to obtain the first wiring substrate 2 made of an aluminum oxide sintered body ($Al_2O_3$), for example, powder of silica ($SiO_2$), magnesia (MgO), or calcia (CaO) serving as a sintering aid is added to $Al_2O_3$ powder, and, after further addition of suitable binder, solvent, and plasticizer, the powder mixture so obtained is kneaded into a slurry. After that, a segmentable ceramic green sheet is obtained from the slurry by a heretofore known molding technique such as the doctor blade method or the calender roll method.

For example, when the first wiring substrate 2 is formed of resin, the first wiring substrate 2 may be formed by molding the resin by means of transfer molding, injection molding, or otherwise using a mold capable of forming a molded body of predetermined shape.

Moreover, the first wiring substrate 2 may be made of a resin-impregnated matrix made of glass fiber, such as glass epoxy resin. In this case, the first wiring substrate 2 may be formed by impregnating a glass fiber-made matrix with a precursor of epoxy resin, and subsequently curing the epoxy resin precursor under heat at a predetermined temperature.

(2) Next, by means of screen printing or otherwise, a metallic paste is applied to or charged into parts of the ceramic green sheet obtained in the above-described step (1) which constitute the electronic device connection pad 3, the external circuit connection electrode, and the wiring conductor including the through conductor and internal wiring.

The metallic paste is prepared by kneading metallic powder made of the earlier described metal material in admixture with suitable solvent and binder until the viscosity is adjusted to an appropriate level. Glass or ceramics may be added to the metallic paste to enhance the joining strength with the first wiring substrate 2.

(3) The next step is working of the above-described green sheet using a mold or the like. The first through hole 2a is formed at a central portion of the green sheet which constitutes the first wiring substrate 2.

(4) Next, a ceramic green sheet stacked body which constitutes the first wiring substrate 2 is produced by stacking ceramic green sheets, each constituting the corresponding one of the insulating layers of the first wiring substrate, and subsequently pressurizing the stack. Moreover, in this step, for example, a green sheet stacked body which constitutes the first wiring substrate 2 may be produced by following the process of forming separate green sheet stacked bodies, each constituting the corresponding one of the layers of the first wiring substrate 2, the process of stacking the green sheet stacked bodies together, and the process of pressurizing the stack.

(5) Next, the ceramic green sheet stacked body is fired at a temperature of about 1500 to 1800° C. to obtain a segmentable wiring board bearing an arrangement of a plurality of first wiring substrates 2. In this step, the above-described metallic paste is fired, concurrently with the firing of the ceramic green sheet which constitutes the first wiring substrate 2, into the electronic device connection pad 3, the external circuit connection electrode, or the wiring conductor.

(6) Next, the segmentable wiring board obtained through the firing step is divided into the plurality of first wiring substrates 2. The division is effected by a technique to break the segmentable-dividable wiring board along split grooves formed in positions of the board which correspond to the outer peripheries of the first wiring substrates 2, or a technique to cut the segmentable wiring board along the positions of the board which correspond to the outer peripheries of the first wiring substrates 2 by means of slicing or otherwise. The split groove may be obtained by forming a small incision, whose dimension is smaller than the thickness of the segmentable wiring board, in the segmentable wiring board by a slicing machine after the firing step. As an alternative, the split groove may be obtained by pressing a cutter blade against the ceramic green sheet stacked body which constitutes the segmentable wiring board, or by forming a small incision, whose dimension is smaller than the thickness of the ceramic green sheet stacked body, in the ceramic green sheet stacked body by a slicing machine.

(7) Next, the second wiring substrate 6 which is joined to the lower surface of the first wiring substrate 2 is prepared. The second wiring substrate 6 is made of electrically insulating ceramics or resin, for example. The second wiring substrate 6 may be produced by a method similar to the method adopted in the production of the first wiring substrate 2, for example, the procedure involving the above-described steps (1) to (6). Moreover, where the second wiring substrate 6 is built as a flexible wiring substrate, it may be produced by following the process of forming a photoresist layer on, for example, a polyimide-made substrate and the process of bonding a polyimide cover film to the upper surface of a circuit pattern formed on the substrate by means of DES (Development Etching Stripping) or otherwise. To form the second through hole 6a in the second wiring substrate 6, a few ways will be considered, i.e. punching a hole in a predetermined position of the second wiring substrate 6 using a die or the like, and forming a hole in the substrate by lasering or photolithography.

(8) Next, the metallic plate 4 which is joined to the lower surface of the second wiring substrate 6 is prepared. The metallic plate 4 is produced by subjecting a metal-made platy material to heretofore known operation such as punching process using a stamping die or etching process. After that, when the metallic plate 4 is formed of a metal material such as a Fe—Ni—Co alloy, 42 Alloy, copper (Cu), or a copper alloy, a nickel plating layer and a gold plating layer may be deposited on the surface of the metallic plate 4. This makes it possible to prevent oxidative corrosion of the surface of the metallic plate 4 effectively.

(9) Next, the metallic plate 4 is joined to the second wiring substrate 6 via the joining material 15. In this step, the second wiring substrate 6 and the metallic plate 4 are firmly bonded to each other by applying a thermosetting resin in paste form (adhesive member) to one of the joining faces of, respectively, the second wiring substrate 6 and the metallic plate 4 by means of screen printing, dispensing, or otherwise, drying the resin paste using an atmosphere furnace of tunnel type, an oven, or the like, and curing the joining material 15 completely under heat by passing a stack of the second wiring substrate 6 and the metallic plate 4 through an atmosphere furnace of tunnel type, an oven, or the like, while heating the stack at about 150° C. for about 90 minutes.

The joining material 15 is obtained by a paste prepared by adding spherical fillers made of, for example, silicon oxide, a curing agent predominantly composed of, for example, acid anhydride such as tetrahydromethylphthalic anhydride, and a coloring agent such for example as carbon powder to a major constituent of, for example, bisphenol A liquid epoxy resin, bisphenol F liquid epoxy resin, or phenol novolac liquid resin, and subsequently mixing these materials and then kneading the mixture by a centrifugal agitator or other means.

Moreover, as the joining material 15, in addition to the aforenamed materials, for example, use can be made of a material composed of epoxy resin, such as bisphenol A epoxy resin, bisphenol A modified epoxy resin, bisphenol F epoxy resin, phenol novolac epoxy resin, cresol novolac epoxy resin, special novolac epoxy resin, phenolic derivative epoxy resin, or bisphenol skeletal epoxy resin, with a curing agent added, for example, an imidazole curing component, an amine curing component, a phosphorus curing component, a hydrazine curing component, an imidazole adduct curing component, an amine adduct curing component, a cationic polymer curing component, or a dicyandiamide curing component.

(10) Next, the external circuit connection electrode disposed on the lower surface of the first wiring substrate 2 is joined, via the external circuit connection member 23, to the external circuit connection electrode disposed on the upper surface of the second wiring substrate 6. As the material for forming the external circuit connection member 23, for example, a metal material such as solder or a resin material such as an anisotropic conductive film may be used.

For example, when the external circuit connection member 23 is formed of solder, a solder cream is applied to the second wiring substrate 6, and, the first wiring substrate 2 is fixedly placed in a predetermined position. Then, in a reflow process, the substrates are joined together under pressure, with electrical conduction established between them.

On the other hand, for example, when the external circuit connection member 23 is formed of anisotropic conductive resin, the external circuit connection member 23 made of anisotropic conductive resin is applied to a predetermined position of the first wiring substrate 2 or the second wiring substrate 6. Then, the first wiring substrate 2 and the second wiring substrate 6 are joined to each other by applying heat under pressure, with electrical conduction established between them.

Moreover, as described above, an adhesive member made of, for example, insulating resin may be additionally placed in a region between adjacent external circuit connection members 23. This makes it possible to fill a gap which communicates with the space between the first wiring substrate 2 and the second wiring substrate 6.

(11) Next, the electronic device 10 is mounted on the electronic device mounting portion 11a of the upper surface of the metallic plate 4, and, each electrode of the electronic device 10 is electrically connected to the electronic device connection pad 3 by wire bonding.

(12) Finally, the lens holder 5 is secured directly to the metallic plate 4. An adhesive is applied to one of or both of the lower end of the side wall 8b of the lens retaining portion 8 and the outer periphery of the metallic plate 4, and, the lower end of the side wall 8b of the lens retaining portion 8 and the outer periphery of the metallic plate 4 are bonded to each other.

The electronic apparatus 21 is obtained by the above steps (1) to (12). Note that the above steps (1) to (12) do not necessarily have to be carried out in the order presented. For example, the joining operation of the metallic plate 4 may be effected after the connection of the first wiring substrate 2 and the second wiring substrate 6.

Second Embodiment

Figure 4:
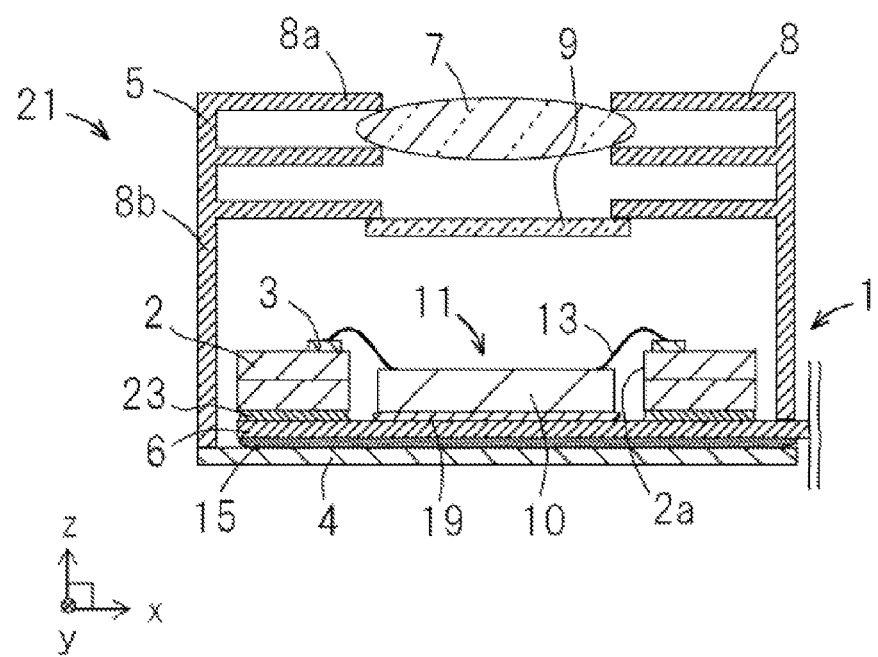
FIG. 4 is a vertical sectional view showing an electronic device mounting substrate and an electronic apparatus according to a second embodiment of the invention.

Next, the electronic device mounting substrate 1 and the electronic apparatus 21 according to a second embodiment of the invention will be described with reference to FIG. 4. FIG. 4 is a vertical sectional view showing the electronic device mounting substrate and the electronic apparatus according to with the second embodiment of the invention.

The electronic device mounting substrate 1 and the electronic apparatus 21 in this embodiment differ from those in the first embodiment in that the second wiring substrate 6 is shaped in a rectangular plate and thus has no second through hole 6a, and the electronic device 10 is mounted on the upper surface of the second wiring substrate 6. Otherwise, this embodiment is identical in structure with the first embodiment, wherefore such constituent components as are common to those of the first embodiment will be identified with the same reference symbols, and the descriptions thereof will be omitted.

In the example shown in FIG. 4, the electronic device 10 is mounted on the upper surface of the second wiring substrate 6 while being housed in the electronic device mounting space 11 defined by the first through hole 2a. More specifically, the electronic device 10 is housed within a recess defined by the inner side surface of the first wiring substrate 2 and the upper surface of the second wiring substrate 6 (electronic device mounting space 11).

Also in this embodiment, the lens holder 5 is secured directly to the metallic plate 4. Thus, when the lens holder 5 is subjected to an external impact, as is the case with the first embodiment, it is possible to reduce a stress transmitted to the first wiring substrate 2 and the second wiring substrate 6, and thereby suppress occurrence of warpage and fracture in the first wiring substrate 2 and the second wiring substrate 6.

Moreover, the electronic device 10 is not mounted on the metallic plate 4 but mounted on the upper surface of the second wiring substrate 6. In this case, when the lens holder 5 is subjected to an external impact, a stress transmitted to the electronic device 10 through the metallic plate 4 can be reduced by the second wiring substrate 6.

Moreover, in this embodiment, in contrast to the first embodiment, the second wiring substrate 6 has no second through hole 6a, wherefore greater flexibility in wiring can be imparted to the second wiring substrate 6. This makes it possible to design the pattern of wiring in the second wiring substrate 6 with consideration given to electrical characteristics, as well as to facilitate electrical wiring connection from the electronic device 10 to the first and second wiring substrates 2 and 6 by wire bonding.

Third Embodiment

Figure 5:
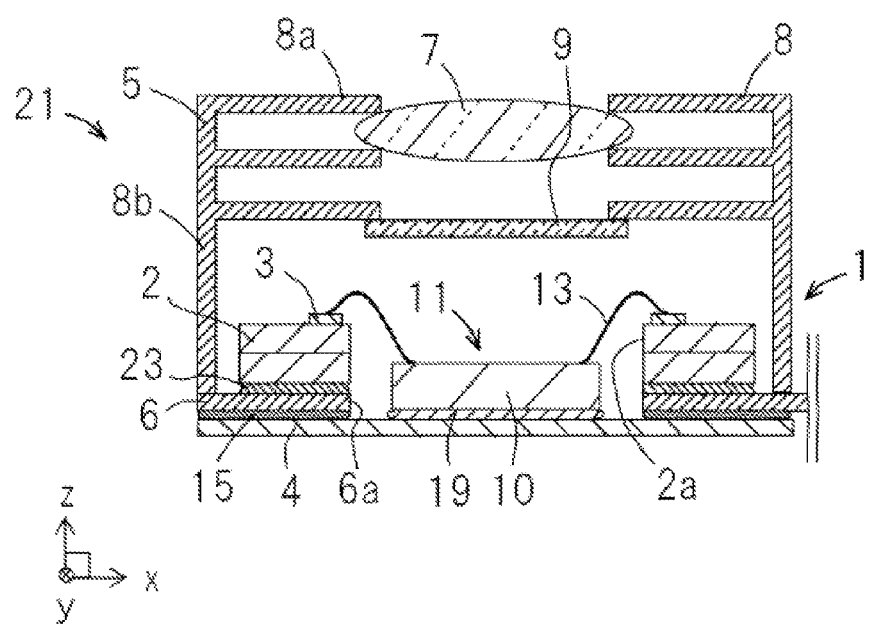
FIG. 5 is a vertical sectional view showing an electronic device mounting substrate and an electronic apparatus according to a third embodiment of the invention.
Figure 6:
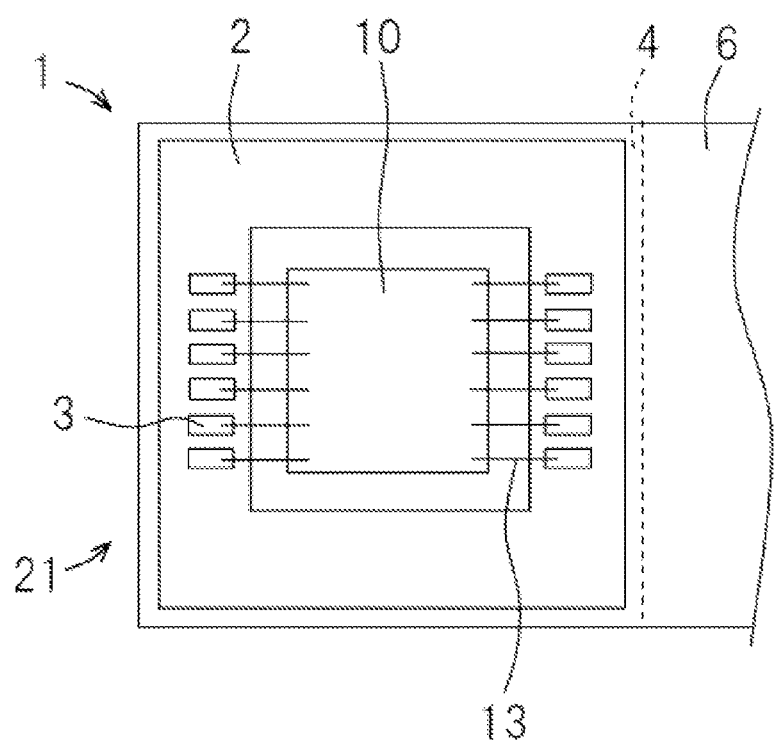
FIG. 6 is a top view showing the appearances of the electronic device mounting substrate and the electronic apparatus according to the third embodiment of the invention, illustrating the positional relationship between outer peripheries of the first wiring substrate and the second wiring substrate.

Next, the electronic device mounting substrate 1 and the electronic apparatus 21 according to a third embodiment of the invention will be described with reference to FIGS. 5 and 6. FIG. 5 is a vertical sectional view showing the electronic device mounting substrate and the electronic apparatus according to the third embodiment of the invention. FIG. 6 is a top view showing the appearances of the electronic device mounting substrate and the electronic apparatus according to the third embodiment of the invention, illustrating the positional relationship between the outer peripheries of the first wiring substrate and the second wiring substrate.

The electronic device mounting substrate 1 and the electronic apparatus 21 in this embodiment differ from those in the first embodiment in that the lens holder 5 is secured directly to the outer periphery of the second wiring substrate 6. Otherwise, this embodiment is identical in structure with the first embodiment, wherefore such constituent components as are common to those of the first embodiment will be identified with the same reference symbols, and the descriptions thereof will be omitted.

As shown in FIGS. 5 and 6, an outer edge at the opposite side of the second wiring substrate 6 to the one side thereof is located more outward than an outer edge at a side of the first wiring substrate 2 which corresponds to the opposite side of the second wiring substrate 6, as viewed from the top. That is, the outside shape of the opposite side of the second wiring substrate 6 to the one side thereof is larger than the outside shape of the corresponding side of the first wiring substrate 2, and thus the outer periphery of the upper surface of the second wiring substrate 6 is exposed beyond the first wiring substrate 2. The lens holder 5 is secured directly to the exposed outer periphery of the second wiring substrate 6.

In the example shown in FIGS. 5 and 6, the outer edge of the metallic plate 4 is positioned so as to overlie the outer edge at the opposite side of the second wiring substrate 6 to the one side thereof, as viewed from the top. As an alternative, in this embodiment, the outer edges of the metallic plate 4 may be located more outward than the outer edge at the opposite side of the second wiring substrate 6 to the one side thereof, as viewed from the top. That is, the outside shape of a side of the metallic plate 4 which corresponds to the opposite side of the second wiring substrate 6 to the one side thereof is equal to or larger than the outside shape of the opposite side of the second wiring substrate 6 to the one side thereof.

When the electronic device mounting substrate 1 and the electronic apparatus 21 are subjected to an external impact, most of the impact is applied to the lens holder 5. In this regard, the lens holder 5 is secured directly to the second wiring substrate 6, wherefore a stress transmitted to the first wiring substrate 2 can be reduced, thus minimizing occurrence of warpage and fracture in the first wiring substrate 2. Consequently, the metallic plate 4 can be made thinner than would be the case of the related art, thus rendering the electronic device mounting substrate 1 and the electronic apparatus 21 lower in profile.

Fourth Embodiment

While, in the first to third embodiments, the lid body constituting the electronic device mounting substrate 1 and the electronic apparatus 21 serves as the lens holder 5, in this embodiment, the lid body is not limited to the lens holder. The lid body may be designed simply as a lid body for providing protection for the first wiring substrate 2, the second wiring substrate 6, and the electronic device 10. That is, the lid body has an open-bottomed hemispherical or dome-like structure composed of a side wall and a top plate, which is not provided with any attachment component such as an optical lens. The thereby constructed lid body is secured directly to the outer periphery of the metallic plate 4 in conformity with the first and second embodiments, or is secured directly to the outer periphery of the second wiring substrate 6 in conformity with the third embodiment. This embodiment affords the same advantageous effects as achieved by the first to third embodiments.

The lid body of this embodiment may be made of either a resin material or a metal material. When the lid body is formed of a metal material, the lid body is, in conjunction with the metallic plate 4, conducive to improvement in shielding against electromagnetic waves.

Moreover, as is the case with the first and second embodiments, the lower end of the side wall of the lid body does not necessarily have to be secured, at its entire perimeter, directly to the outer periphery of the metallic plate 4, and thus, the lower end may be partly secured directly to the outer periphery. Moreover, as is the case with the third embodiment, the lower end of the side wall of the lid body does not necessarily have to be secured, at its entire perimeter, directly to the outer periphery of the second wiring substrate 6, and thus, the lower end may be partly secured directly to the outer periphery.

In the case where the lower end of the side wall is cut away, such a cutaway constitutes a clearance from which is extended part of the second wiring substrate 6 which is a flexible wiring substrate.

Moreover, when the electronic device 10 is an image pickup device or a light-emitting device, the upper surface of the lid body may be made of a member having high transparency, such as a glass material or an optical filter.

Other Modified Examples

The inner side surface of the second through hole 6a constituted by the interior of the frame-shaped second wiring substrate 6 may be located more inward than the inner side surface of the first through hole 2a constituted by the interior of the frame-shaped first wiring substrate 2, expressed differently, the second through hole 6a may be made smaller in hole diameter than the first through hole 2a. With this arrangement, the area of connection between the first wiring substrate 2 and the second wiring substrate 6 is wider than would be a case where, for example, the inner side surface of the second through hole 6a is located more outward than the inner side surface of the first through hole 2a. Moreover, in addition to this arrangement, by locating the outer side surface of the second wiring substrate 6 more outward than the outer side surface of the first wiring substrate 2, even if the first wiring substrate 2 and the second wiring substrate 6 become misaligned when joined to each other, it is possible to secure a designed joining area without fail. This makes it possible to suppress occurrence of separation between the first wiring substrate 2 and the metallic plate 4 or occurrence of cracking. Moreover, a fillet can be formed in the external circuit connection member 23 or in a vicinal insulating adhesive member. This makes it possible to increase the joining strength between the first wiring substrate 2 and the second wiring substrate 6.

The inner side surface of the second through hole 6a constituted by the interior of the frame-shaped second wiring substrate 6 may be located more outward than the inner side surface of the first through hole 2a constituted by the interior of the frame-shaped first wiring substrate 2, expressed differently, the second through hole 6a may be made larger in hole diameter than the first through hole 2a. With this arrangement, the inner side surface of the second through hole 6a of the second wiring substrate 6 can be sufficiently spaced away from the electronic device mounting portion 11a. This makes it possible to leave the electronic device mounting portion 11a of predetermined size properly even if a slight misalignment arises in the process of joining the second wiring substrate 6 to the metallic plate 4.

Moreover, the outer edge of the second wiring substrate 6 (except for the side toward a positive x-axis direction) may be located more inward than the outer edge of the first wiring substrate 2, as viewed from the top. With this arrangement, the external circuit connection member 23 can be made in the form of a fillet extending from the outer side surface of the second wiring substrate 6 to the lower surface of the first wiring substrate 2. This makes it possible to increase the joining force between the first wiring substrate 2 and the second wiring substrate 6.

Moreover, with this arrangement, in the process of joining the first wiring substrate 2 and the second wiring substrate 6 together, the external circuit connection member 23 is restrained from spreading over the outer side surface of the first wiring substrate 2. This makes it possible to diminish the likelihood that a thermal stress will be generated due to the difference in thermal expansion between a thin layer of the external circuit connection member 23 spreading over the outer side surface of the first wiring substrate 2 and the first wiring substrate 2, and thereby diminish the likelihood that the external circuit connection member 23 will become cracked with the consequence that the propagation of the crack causes separation of the first wiring substrate 2 from the second wiring substrate 6.

Moreover, when the joining material 15 is formed of insulating resin, it is preferable that the inner end of the joining material 15 is located more inward than the inner side surface of the second through hole 6a. With this arrangement, for example, in the event of condensation that forms on the upper surface of the metallic plate 4 when the electronic device 10 undergoes heat generation or cooling, it is possible to restrain moisture from finding its way into a region between the second wiring substrate 6 and the joining material 15, and thereby suppress occurrence of migration in the wiring conductor and so forth exposed at the lower surface of the second wiring substrate 6. In addition, it is also possible to suppress occurrence of short-circuiting between the second wiring substrate 6 and the metallic plate 4 in the presence of condensation, and thereby suppress occurrence of migration in the metallic plate 4. Consequently, the joining material 15 is restrained against separation from the metallic plate 4.

Moreover, the first wiring substrate 2 may be composed of a first frame body of which an interior constitutes a third through hole, and a second frame body placed on the upper surface of the first frame body, an interior of the second frame body constituting a fourth through hole. The third through hole and the fourth through hole are communicated with each other to form the first through hole 2a. Moreover, the inner peripheral surface of the fourth through hole of the second frame body and the upper surface of the first frame body define a shoulder on which is disposed an additional electronic device connection pad 3. Where the connecting member 13 is formed of a bonding wire, the placement of the electronic device connection pad 3 on the shoulder makes it possible to lower the level of the vertex of the bonding wire. Thus, in the process of sealing the electronic device mounting substrate 1 with the lid body, the likelihood of contact between the bonding wire and the lid body is diminished.

It should be understood that the application of the invention is not limited to the embodiments described heretofore, and that various modifications, including changes of relevant numerical values, are possible.

While, in the above-described embodiments, the first through hole 2a of the first wiring substrate 2 and the second through hole 6a of the second wiring substrate 6 have a rectangular opening, the opening of each through hole may be given a circular shape or a polygonal shape other than the rectangular shape.

Moreover, there is no particular limitation to the arrangement, number, configuration, and so forth of the electronic device connection pad 3 in the embodiments.

The invention claimed is:

1. An electronic device mounting substrate, comprising:
a first wiring substrate shaped in a rectangular frame, an interior of the rectangular frame constituting a first through hole;
a second wiring substrate shaped in a rectangular frame or plate, the second wiring substrate being disposed overlying a lower surface of the first wiring substrate and be electrically connected to the first wiring substrate, one of outer edges of the second wiring substrate being located more outward than a corresponding one of outer edges of the first wiring substrate;
a metallic plate disposed overlying a lower surface of the second wiring substrate so that the second wiring substrate is sandwiched between the metallic plate and the first wiring substrate, outer edges of the metallic plate being located more outward than the outer edges of the first wiring substrate and more inward than the one of the outer edges of the second wiring substrate; and
a lid body secured to an outer periphery of the metallic plate, with the one of the outer edges of the second wiring substrate lying in between, covered the first wiring substrate and the second wiring substrate, a frame interior of the first wiring substrate, or a frame interior of each of the first wiring substrate and the second wiring substrate, constituting an electronic device mounting space.

2. The electronic device mounting substrate according to claim 1,
wherein the second wiring substrate is shaped in a frame of which an interior constitutes a second through hole which is located overlying the first through hole, and
the metallic plate has an electronic device mounting portion formed on an upper surface region thereof which is exposed to the second through hole within the electronic device mounting space.

3. The electronic device mounting substrate according to claim 1,
wherein the first wiring substrate is a ceramic wiring substrate, and
the second wiring substrate is a flexible wiring substrate.

4. The electronic device mounting substrate according to claim 2,
wherein an electronic device which is mounted on the electronic device mounting portion is an image pickup device, a light-emitting device, or a light-receiving device, and
the lid body comprises a lens and a lens retaining portion which retains the lens in a manner such that an optical axis is directed toward the electronic device mounting portion.

5. An electronic device mounting substrate, comprising:
a first wiring substrate shaped in a rectangular frame, an interior of the rectangular frame constituting a first through hole;
a second wiring substrate shaped in a rectangular frame or plate, the second wiring substrate being disposed overlying a lower surface of the first wiring substrate and be electrically connected to the first wiring substrate, one of outer edges of the second wiring substrate being located more outward than a corresponding one of outer edges of the first wiring substrate;
a rectangular metallic plate disposed overlying a lower surface of the second wiring substrate so that the second wiring substrate is sandwiched between the rectangular metallic plate and the first wiring substrate; and
a lid body secured to an outer periphery of the second wiring substrate covered the first wiring substrate,
a frame interior of the first wiring substrate, or a frame interior of each of the first wiring substrate and the second wiring substrate, constituting an electronic device mounting space.

6. An electronic apparatus, comprising:
the electronic device mounting substrate according to claim 1; and
an electronic device mounted within the electronic device mounting space.

7. An electronic apparatus, comprising:
the electronic device mounting substrate according to claim 5; and
an electronic device mounted within the electronic device mounting space.

* * * * *